US010438653B2

United States Patent
Hush et al.

(10) Patent No.: US 10,438,653 B2
(45) Date of Patent: *Oct. 8, 2019

(54) APPARATUSES AND METHODS FOR SUBROW ADDRESSING

(71) Applicant: Micron Technology, Inc., Boise, ID (US)

(72) Inventors: Glen E. Hush, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/115,850

(22) Filed: Aug. 29, 2018

(65) Prior Publication Data

US 2019/0189187 A1 Jun. 20, 2019

Related U.S. Application Data

(63) Continuation of application No. 15/846,410, filed on Dec. 19, 2017, now Pat. No. 10,332,586.

(51) Int. Cl.
*G11C 8/12* (2006.01)
*G11C 11/408* (2006.01)
*G11C 11/4074* (2006.01)

(52) U.S. Cl.
CPC ............ *G11C 11/4085* (2013.01); *G11C 8/12* (2013.01); *G11C 11/4074* (2013.01); *G11C 11/4087* (2013.01)

(58) Field of Classification Search
CPC .................................. G11C 8/12; G11C 8/10
(Continued)

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| EP | 0214718 | 3/1987 |

(Continued)

OTHER PUBLICATIONS

International Search Report and Written Opinion for related PCT Application No. PCT/US2018/064658, dated Apr. 2, 2019, 12 pages.

(Continued)

*Primary Examiner* — Son L Mai
(74) *Attorney, Agent, or Firm* — Brooks, Cameron & Huebch, PLLC

(57) ABSTRACT

Systems, apparatuses, and methods related to subrow addressing for electronic memory and/or storage are described. Independent subrow addressing may enable energy consumed by performance of an operation on a particular subset of data values stored by a row to more closely correspond to the size of the particular subset of data values relative to energy consumed by addressing and activating the complete row. For instance, one such apparatus includes a plurality of subrows within a row of memory cells and a controller configured to selectably address and manage an activation state of each subrow of the plurality of subrows. The apparatus further includes subrow driver circuitry coupled to the controller. The subrow driver circuitry is configured to maintain one or more subrows of the plurality in the activation state based at least in part on signaling from the controller.

20 Claims, 6 Drawing Sheets

(58) Field of Classification Search
USPC .................................................. 365/230.06
See application file for complete search history.

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffmann et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,416,748 A | 5/1995 | Fujita | |
| 5,440,482 A | 8/1995 | Davis | |
| 5,440,516 A | 8/1995 | Slemmer | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,490,119 A | 2/1996 | Sakurai et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,774,409 A | 6/1998 | Yamazaki et al. | |
| 5,787,458 A | 7/1998 | Miwa | |
| 5,854,636 A | 12/1998 | Watanabe et al. | |
| 5,862,098 A | 1/1999 | Jeong | |
| 5,867,429 A | 2/1999 | Chen et al. | |
| 5,870,504 A | 2/1999 | Nemoto et al. | |
| 5,915,084 A | 6/1999 | Wendell | |
| 5,917,770 A | 6/1999 | Tanaka | |
| 5,935,263 A | 8/1999 | Keeth et al. | |
| 5,943,289 A * | 8/1999 | Ahn | G11C 8/14 365/185.23 |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,314,042 B1 | 11/2001 | Tomishima et al. | |
| 6,335,901 B1 | 1/2002 | Morita et al. | |
| 6,389,507 B1 | 5/2002 | Sherman | |
| 6,418,498 B1 | 7/2002 | Martwick | |
| 6,452,862 B1 | 9/2002 | Tomotani | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth et al. | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,366,001 B2 | 4/2008 | Hanzawa et al. | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 | 8/2012 | Akerib et al. | |
| 8,274,841 B2 | 9/2012 | Shimano et al. | |
| 8,279,683 B2 | 10/2012 | Klein | |
| 8,310,884 B2 | 11/2012 | Iwai et al. | |
| 8,332,367 B2 | 12/2012 | Bhattacherjee et al. | |
| 8,339,824 B2 | 12/2012 | Cooke | |
| 8,339,883 B2 | 12/2012 | Yu et al. | |
| 8,347,154 B2 | 1/2013 | Bahali et al. | |
| 8,351,292 B2 | 1/2013 | Matano | |
| 8,356,144 B2 | 1/2013 | Hessel et al. | |

(56) References Cited

U.S. PATENT DOCUMENTS

| | | |
|---|---|---|
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,659,605 B1 | 5/2017 | Zawodny et al. |
| 9,659,610 B1 | 5/2017 | Hush |
| 9,697,876 B1 | 7/2017 | Tiwari et al. |
| 9,761,300 B1 | 9/2017 | Willcock |
| 9,997,212 B1 | 6/2018 | Finkbeiner et al. |
| 10,026,468 B2 | 7/2018 | Daily |
| 10,055,228 B2 | 8/2018 | Lin |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0247953 A1 | 10/2007 | Huang |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0149900 A1 | 6/2010 | Kitayama |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0309743 A1 | 10/2015 | Sohn et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |

(56) References Cited

U.S. PATENT DOCUMENTS

| | | |
|---|---|---|
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0216912 A1 | 7/2016 | Muralimanohar et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0365129 A1 | 12/2016 | Willcock |
| 2016/0371033 A1 | 12/2016 | La Fratta et al. |
| 2017/0052906 A1 | 2/2017 | Lea |
| 2017/0083401 A1 | 3/2017 | Ryu et al. |
| 2017/0178701 A1 | 6/2017 | Willcock et al. |
| 2017/0192844 A1 | 7/2017 | Lea et al. |
| 2017/0213586 A1 | 7/2017 | Kang et al. |
| 2017/0228192 A1 | 8/2017 | Willcock et al. |
| 2017/0235515 A1 | 8/2017 | Lea et al. |
| 2017/0236564 A1 | 8/2017 | Zawodny et al. |
| 2017/0242902 A1 | 8/2017 | Crawford et al. |
| 2017/0243623 A1 | 8/2017 | Kirsch et al. |
| 2017/0262369 A1 | 9/2017 | Murphy |
| 2017/0263295 A1 | 9/2017 | Xiao et al. |
| 2017/0263306 A1 | 9/2017 | Murphy |
| 2017/0269865 A1 | 9/2017 | Willcock et al. |
| 2017/0269903 A1 | 9/2017 | Tiwari |
| 2017/0277433 A1 | 9/2017 | Willcock |
| 2017/0277440 A1 | 9/2017 | Willcock |
| 2017/0277581 A1 | 9/2017 | Lea et al. |
| 2017/0277637 A1 | 9/2017 | Willcock et al. |
| 2017/0278559 A1 | 9/2017 | Hush |
| 2017/0278584 A1 | 9/2017 | Rosti |
| 2017/0285988 A1 | 10/2017 | Dobelstein |
| 2017/0293434 A1 | 10/2017 | Tiwari |
| 2017/0301379 A1 | 10/2017 | Hush |
| 2017/0309314 A1 | 10/2017 | Zawodny et al. |
| 2017/0336989 A1 | 11/2017 | Zawodny et al. |
| 2017/0337126 A1 | 11/2017 | Zawodny et al. |
| 2017/0337953 A1 | 11/2017 | Zawodny et al. |
| 2017/0352391 A1 | 12/2017 | Hush |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1999 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Proceeding-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012 (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

\* cited by examiner

US 10,438,653 B2

APPARATUSES AND METHODS FOR SUBROW ADDRESSING

PRIORITY INFORMATION

This application is a Continuation of U.S. application Ser. No. 15/846,410, filed Dec. 19, 2017, the contents of which are included herein by reference.

TECHNICAL FIELD

The present disclosure relates generally to semiconductor memory and methods, and more particularly, to apparatuses and methods for subrow addressing.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can include a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of operations. In many instances, addressing protocols may activate a complete row of memory cells and the data values from all of the memory cells in the row may be accessed regardless of how much of the data is intended to be used in performing an operation by a processing resource.

DETAILED DESCRIPTION

Figure 1:
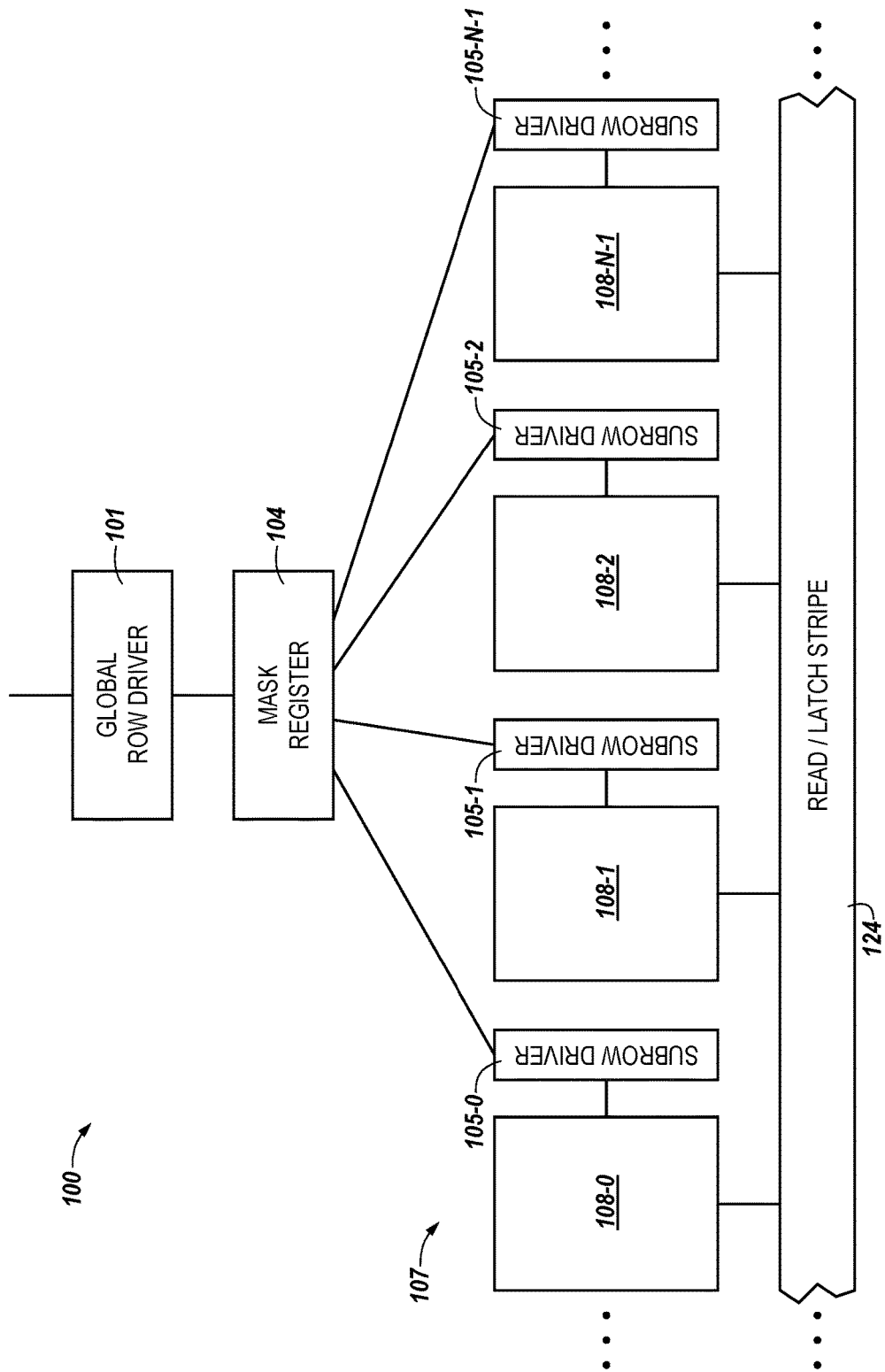
FIG. 1 is a block diagram illustrating circuitry for subrow addressing in accordance with a number of embodiments of the present disclosure.

The present disclosure includes systems, apparatuses, and methods related to subrow addressing in a row of a memory array. Independent subrow addressing in accordance with embodiments described herein may provide various benefits, such as reducing energy consumption compared to previous approaches to array operation. For example, a number of embodiments may enable energy consumed by performance of an operation on a particular subset of data values stored by the row to more closely correspond to the size of the particular subset of data values relative to energy consumed by addressing and activating the complete row. For instance, one such apparatus includes a plurality of subrows within a row of memory cells and a controller configured to selectably address and manage an activation state of each subrow of the plurality of subrows. The apparatus further includes subrow driver circuitry coupled to the controller. The subrow driver circuitry is configured to maintain one or more subrows of the plurality in the activation state based at least in part on signaling from the controller.

Implementations of address circuitry (e.g., for a DRAM configuration conforming to standards and protocols such as JEDEC, DDR3, DDR4, etc.) for a memory device may be configured to activate a complete row of memory cells at a time (e.g., per write/read cycle), for instance, within a subarray including a plurality of rows of memory cells. Such an implementation may further access the data values from all of the memory cells in the row via sensing circuitry (e.g., read/latch circuitry, as described herein). A host and/or a controller for the memory device may then access the data values stored by the sensing circuitry to enable performance of an operation by a processing resource on the stored data values. However, the operation may be performed, for instance, on only a portion of the data values stored by the sensing circuitry (e.g., 128 data values from among 16,384 data values).

Accessing all the memory cells and storing all of the data values from the complete row, regardless of the amount of data to which the operation is directed, may result in various drawbacks. For instance, at least half of the energy (e.g., electrical power) used by a memory device may result from performance of accessing all the memory cells and storing all of the data values from complete rows to enable performance of operations thereon.

In contrast, one or more subrows may be specifically addressed at positions within the row that include the data values upon which the operation is intended to be performed. The subrows described herein are intended to mean separate portions, which may be sequential, that each includes different memory cells of the complete row. These subrows may be specifically addressed by inhibiting activation of a number of other subrows at particular positions in the row at which data values are stored that are not to be utilized in performance of the operation. Inhibiting activation of a number of subrows may notably reduce energy consumption by the memory device.

For example, in an embodiment in which a row includes 16,384 (16K) memory cells addressed as sixteen subrows each including 1024 memory (1K) cells, addressing and activating only one 1K subrow to access the data values stored therein (e.g., the data values intended for use in performance of an operation) may reduce the energy consumption to one sixteenth ($1/16$) of that potentially used for addressing and activation of all 16 of the 1K subrows in combination with storage by the sensing circuitry of data values accessed therefrom. Hence, a number of embodiments of the present disclosure may provide various benefits (e.g., a technical advantage) by, for example, independent subrow addressing enabling energy consumed by performance of an operation on a particular subset of data values stored by a row to more closely correspond to the size of the particular subset of data values relative to energy consumed by addressing and activating the complete row.

The embodiments of 16K memory cells per row and/or being divided into sixteen 1K subrows are presented by way of example and not limitation. For example, a row may include 1024, 2048, 4,096, 8192, or 16,384 memory cells, among other possibilities, and each row may include a plurality of portions that divide the memory cells into 2, 4, 8, 16, or 32 subrows, among other possibilities.

The figures herein follow a numbering convention in which the first digit or digits of a reference number correspond to the figure number and the remaining digits identify an element or component in the figure. Similar elements or components between different figures may be identified by the use of similar digits. For example, 104 may reference element "04" in FIG. 1 and a similar element may be referenced as 204 in FIG. 2.

FIG. 1 is a schematic diagram illustrating circuitry 100 for subrow addressing in accordance with a number of embodiments of the present disclosure. The circuitry 100 for subrow addressing illustrated in FIG. 1 includes a global row driver 101 configured to activate a complete row 107, and all memory cells therein, when the row is addressed. A mask register 104 may include circuitry (e.g., latches) configured to selectably enable (e.g., direct) inactivation of a number of portions (e.g., one or more of subrows 108-0, 108-1, . . . , 108-N−1) of the row 107 that would otherwise be activated by the row being addressed by the global row driver 101.

Figure 4:
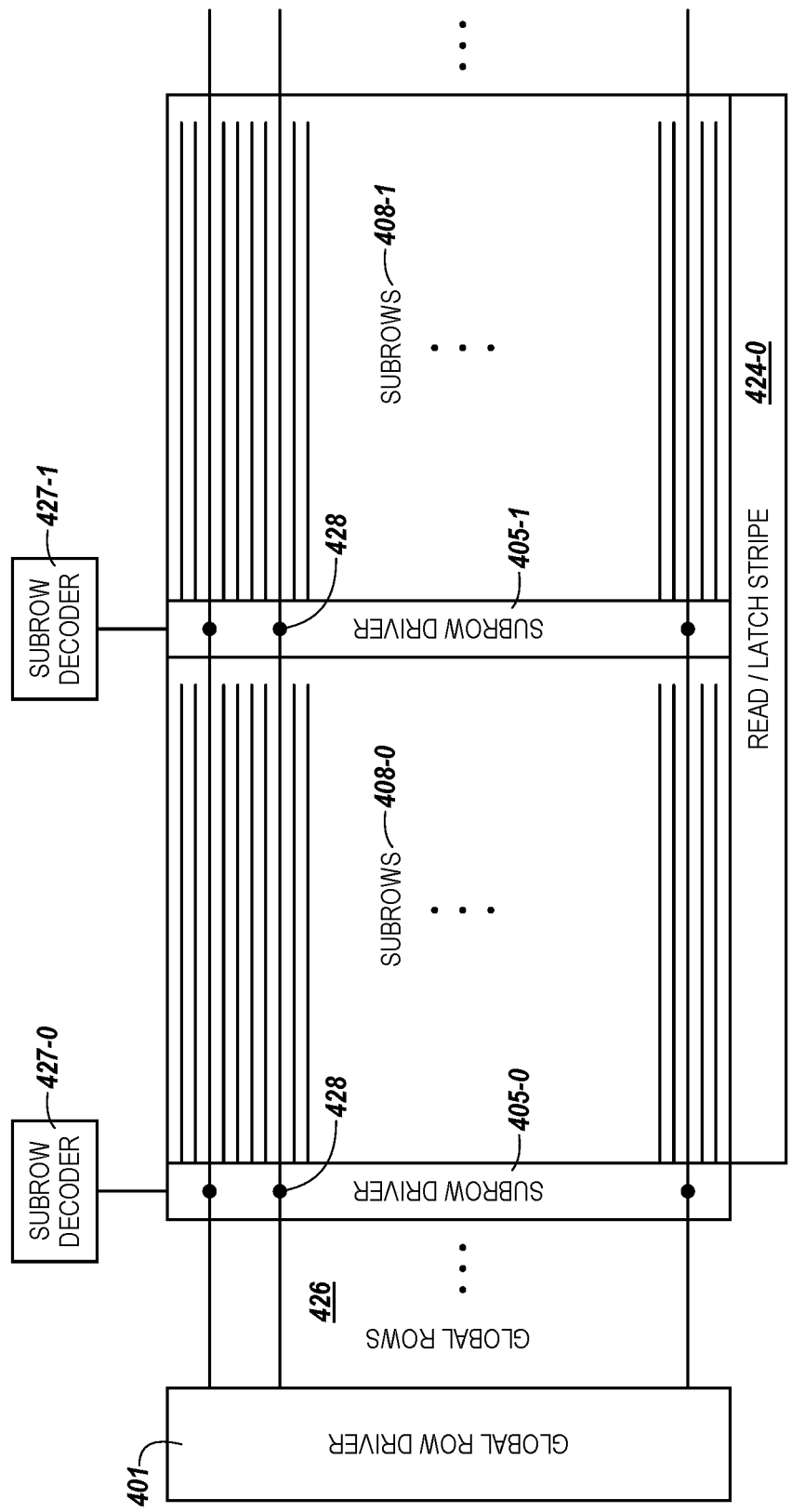
FIG. 4 is a schematic diagram illustrating circuitry for subrow addressing in accordance with a number of embodiments of the present disclosure.

The mask register 104 may selectably enable inactivation of a subrow at a particular position (e.g., subrow 108-0) in the row 107 by inhibiting (e.g., overriding, cancelling, etc.) a signal from the global row driver 101 to activate subrow driver circuitry (e.g., subrow drivers shown at 105-0, 105-1, . . . , 105-N−1 in FIG. 1 and subrow decoders shown at 427-0 and 427-1 in FIG. 4) coupled to the subrow such that the subrow remains inactive. The individual portions of the subrow driver circuitry that each include a subrow driver and a subrow decoder are shown at 105-0, 105-1, . . . , 105-N−1 in FIG. 1 as being labeled "subrow driver" for the sake of brevity.

A plurality of subrows in a particular row may, in a number of embodiments, each have their activation inhibited by entries corresponding to the particular subrows being latched (e.g., stored) by the mask register 104. Such entries may be selected by a host (e.g., as shown at 211 and described in connection with FIG. 2) and/or a user (not shown). The plurality of selected subrows may be adjacent to each other and/or may be separated throughout a particular row (e.g., dependent upon which data values are intended for use in performing an operation). For example, the data values stored in subrows 1, 3, and 9 of a particular row may be selected for use in performance of an operation by latching entries in the mask register 104 to direct that subrows 2, 4-8, and 10-16, in some embodiments, remain inactive.

The boxes illustrated at 108-0, 108-1, . . . , 108-N−1 in FIG. 1 may, in a number of embodiments, each represent a different subrow (e.g., 1K memory cells) and reference number 107 may represent a single complete row (e.g., 16K memory cells with 16 subrows). Alternatively, the boxes 108 in FIG. 1 may, in a number of embodiments, each represent a different portion (e.g., mat) of a subarray of memory cells and reference number 107 may represent a single complete subarray (e.g., as shown at each of 325-0, 325-1, . . . , 325-N−1 and described in connection with FIG. 3). Different mats may each include a plurality of subrows. Each mat may include one or more subrows that may be vertically aligned in each separate row (e.g., as shown at 308-0, 308-1, . . . , 308-N−1 and/or 408-0 and 408-1 and described in connection with FIGS. 3 and 4, respectively). A subarray (e.g., of a plurality of subarrays) and/or a mat of the subarray may be formed, in a number of embodiments, to include 64, 128, or 256 separate rows. Each row in a subarray, or in a combination of the mats, may include, for example, 16K memory cells separated into 16 subrows.

A read/latch stripe 124 shown in FIG. 1 may represent a stripe of sensing circuitry (e.g., a group of sense amplifiers) configured to store (e.g., latch) data values of accessed memory cells of a particular row. The read/latch stripe 124 also may be referred to as a portion, or area, of circuitry 100. In a number of embodiments, the sensing circuitry of the read/latch stripe 124 may include a plurality of sense amplifiers (e.g., as shown at 506 and described in connection with FIG. 5) coupled to a respective plurality of columns (e.g., as shown at 322 and described in connection with FIG. 3). The read/latch stripe 124 shown in FIG. 1 may correspond to the read/latch stripes shown at 324-0, 324-1, . . . , 324-N−1 in FIG. 3 coupled to each of subarrays 325-0, 325-1, . . . , 325-N−1. The subrow at the particular position (e.g., subrow 108-0) remaining inactive may prevent access to a plurality of memory cells of the subrow by the sense amplifiers corresponding to the plurality of memory cells. To prevent access by the sense amplifiers may, as a consequence, prevent storage of a number of data values by a plurality of sense amplifiers corresponding to the plurality of memory cells.

The connections between the various elements of the circuitry 100 in FIG. 1 are intended to represent the elements being coupled (e.g., direct or indirect coupling between elements). In a number of embodiments, the mask register 104 may be coupled to the global row driver 101 to detect that the global row driver 101 has selected a particular row for activation. Responsive to the mask register 104 detecting that a particular row, and all the memory cells therein, may be activated, the mask register 104 may refer to (e.g., read) latched entries corresponding to the particular row being selected and inhibit activation of a number of subrow drivers 105 for subrows 108 corresponding to the latched entries (e.g., corresponding to particular subrow addresses). Activation of the particular subrow may be inhibited via deselect signals (e.g., as described further in connection with FIG. 4) consistent with latched entries in the mask register 104 being sent by a controller 140 coupled to respective subrow drivers 105.

Figure 2:
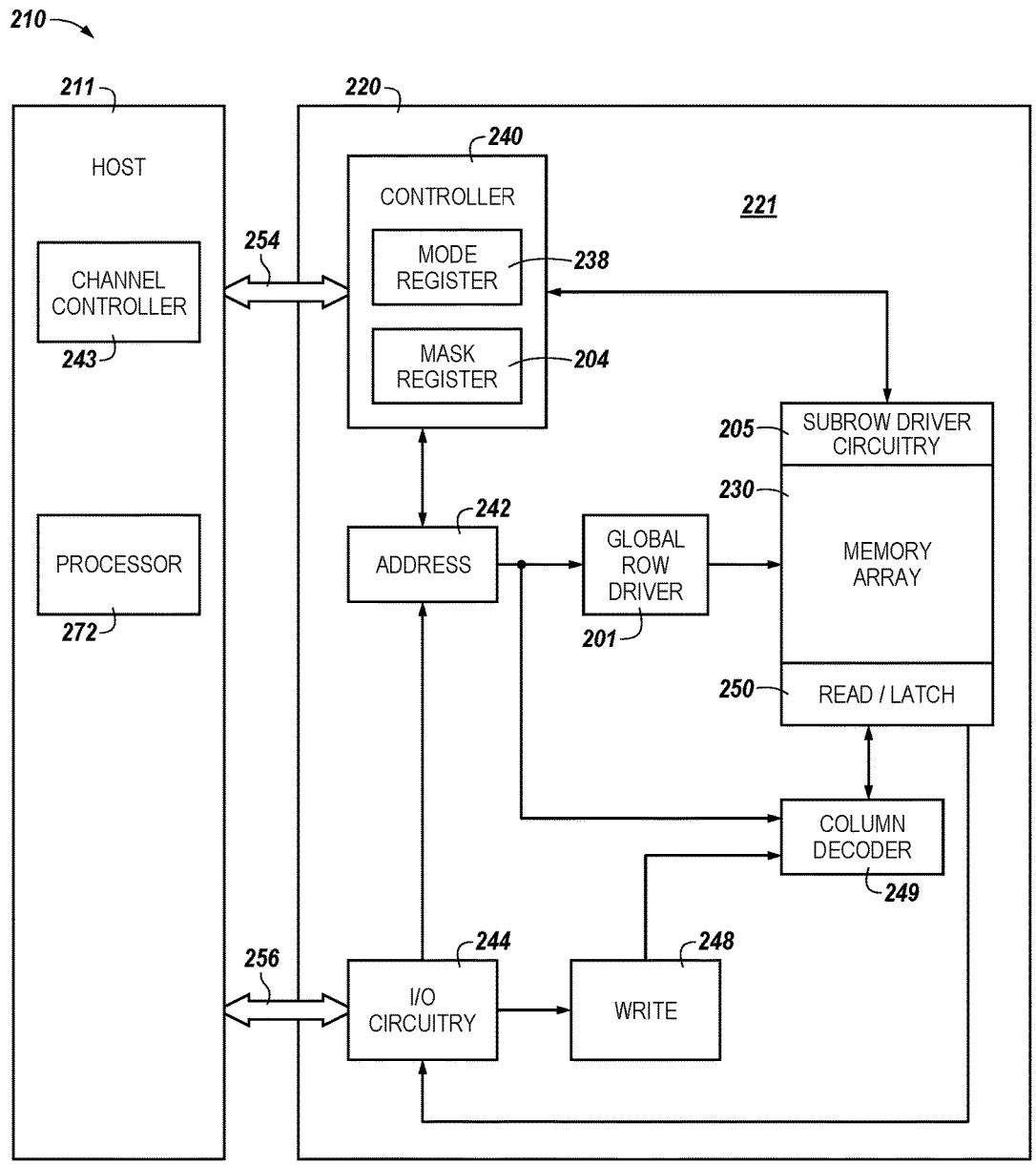
FIG. 2 is a block diagram of an apparatus in the form of a computing system including a memory device in accordance with a number of embodiments of the present disclosure.

FIG. 2 is a block diagram of an apparatus in the form of a computing system 210 including a memory device 220 in accordance with a number of embodiments of the present disclosure. The system 210 may be a laptop computer, tablet computer, personal computer, digital camera, digital recording and playback device, mobile telephone, personal digital assistant (PDA), memory card reader, interface hub, sensor, or Internet-of-Things (IoT) enabled device, among other systems. As used herein, a memory device 220, controller 240, subrow driver circuitry 205, memory array 230, read/latch circuitry 250, including sense amplifiers (e.g., sense amplifier 506 as shown in and described in connection with FIG. 5), among other circuitry for subrow addressing shown and described herein, might each also be separately considered an "apparatus." The memory device 220, controller 240, memory array 230, etc., may form a bank 221 of the system 210 that includes a plurality of subarrays of memory cells (e.g., as shown at 325-0, 325-1, . . . , 325-N−1 and described in connection with FIG. 3).

The circuitry 100 for subrow addressing illustrated in FIG. 1 is intended to represent an embodiment of interaction between coupled circuit elements and is not necessarily intended to show positioning and/or arrangement of one circuit element relative to another circuit element. For example, as illustrated in FIG. 2, the mask register 204 may be physically associated with and/or part of (e.g., coupled to) the controller 240 (e.g., to enable selectable and changeable storage of latched entries therein), along with being coupled to the subrow driver circuitry 205 (e.g., including the subrow drivers and/or subrow decoders). The global row driver 201 may, in a number of embodiments, be coupled to the address circuitry 242, along with being coupled to the mask register 204 and/or the subrow driver circuitry 205.

In some embodiments, the subrow driver circuitry described herein (e.g., as shown at 205) may be formed as a multiplexer configured to selectably control activation of the different subrows in a row and/or a subarray. As such, in a number of embodiments, the row and/or the subarray may be formed without subrow drivers and subrow decoders positioned between the subrows.

As described herein, various embodiments may allow a computing system 210 to allocate a number of locations (e.g., subarrays) in a bank to store (e.g., hold) data. An embodiment of a bank and/or a section of a bank that may include a plurality of subarrays is shown at 221 and 323 and described in connection with FIGS. 2 and 3, respectively, although other configurations are within the scope of the present disclosure. A host (e.g., as shown at 211) and/or a controller (e.g., as shown at 240) may perform address resolution on an entire block of instructions (e.g., commands associated with executing a program) and data and may direct (e.g., control) allocation and storage of data and commands into allocated locations (e.g., subarrays, portions of subarrays, and/or subrow driver circuitry for subrows) within a bank and/or to an external destination.

In a number of embodiments, a row (e.g., as shown at 107 in FIG. 1 and at 319 in FIG. 3) of virtual address space in a memory device (e.g., as shown at 220 in FIG. 2) may have a bit length of 16K bits (e.g., corresponding to 16,384 memory cells or complementary pairs of memory cells in a DRAM configuration). Read/latch circuitry (e.g., as shown as a number of stripes at 124 and 324 in FIGS. 1 and 3, respectively, and at 250 in FIG. 2) for such a 16K bit row may include a corresponding 16K sense amplifiers and associated circuitry (e.g., as shown at 506 in FIG. 5) formed on pitch with the sense lines selectably coupled to corresponding memory cells in the 16K bit row. A sense amplifier in the memory device may operate as a cache for a single data value (bit) from the row of memory cells sensed by the read/latch circuitry 250 (e.g., sensed by and/or stored in the sense amplifier).

A number of embodiments of the present disclosure include read/latch circuitry (e.g., sense amplifiers 506 and associated circuitry), which may be formed on pitch with sense lines of an array of memory cells. The read/latch circuitry and other data storage components described herein are capable of performing data sensing and/or storage (e.g., caching, latching, buffering etc.) of data local to the array of memory cells.

In order to appreciate the improved subrow addressing techniques described herein, a discussion of an apparatus for implementing such techniques (e.g., a memory device 220 having these capabilities and an associated host 211) follows. According to various embodiments, program instructions (e.g., commands) involving a memory device having the subrow addressing capabilities described herein may distribute implementation of the commands (e.g., signals) and data over multiple read/latch and subrow addressing circuitries that may implement operations and may move and store the commands and data within the memory array (e.g., without having to transfer such back and forth over a bus between a host and the memory device). Thus, data for a memory device having the subrow addressing capabilities described herein may be accessed and used in less time, along with using less power. For example, a time and power advantage may be realized by increasing the speed, rate, and/or efficiency of data being accessed only from a number subrows and stored in read/latch circuitry (e.g., sensing circuitry) in order to enable data processing for requested memory operations (e.g., reads, writes, logical operations, etc.) to be performed only on data values from subrows in which data values intended for use in the operations are stored.

The system 210 may include host 211 coupled to memory device 220, which includes the memory array 230 and the controller 240, among the various circuitry for subrow addressing, as shown and described herein. Host 211 may be responsible for execution of an operating system (OS) and/or various applications that may be loaded thereto (e.g., from memory device 220 via controller 240). Host 211 may include a system motherboard and backplane and may include a number of processing resources (e.g., one or more processors 272, microprocessors, or some other type of controlling circuitry) capable of accessing the memory device 220 (e.g., via controller 240) to perform operations on data values moved from the memory device 220 (e.g., using subrow addressing signals provided via controller 240). Controller 240 also may, in a number of embodiments, include a number of processing resources for performance of processing operations. The system 210 that may include separate integrated circuits or both the host 211 and the memory device 220 may be on the same integrated circuit. The system 210 may, for instance, be a server system and a high performance computing (HPC) system or a portion thereof. Although the example shown in FIG. 2 illustrates a system having a Von Neumann architecture, embodiments of the present disclosure may be implemented in non-Von Neumann architectures, which may not include one or more components (e.g., CPU, ALU, etc.) often associated with a Von Neumann architecture.

The controller 240 (e.g., bank control logic and sequencer) may include control circuitry, in the form of hardware, firmware, or software, or combinations thereof. As an example, the controller 240 may include a state machine, a sequencer, and/or some other types of control circuitry, which may be implemented in the form of an application specific integrated circuit (ASIC) coupled to a printed circuit board. In a number of embodiments, the controller 240 may be co-located with the host 211 (e.g., in a system-on-chip (SOC) configuration).

For clarity, description of the system 210 has been simplified to focus on features with particular relevance to the present disclosure. For example, the array 230 may be a DRAM array, SRAM array, STT RAM array, PCRAM array, TRAM array, RRAM array, FeRAM array, phase-change memory array, 3D XPoint™ array, NAND flash array, and/or NOR flash array, for instance. The array 230 may include memory cells arranged in rows (e.g., in a plurality of subarrays) coupled by access lines (which may be referred to herein as word lines or select lines) and columns coupled by sense lines (which may be referred to herein as data lines or digit lines). Although a single bank 221 and a single memory array 230 are shown in FIG. 2, embodiments are not so limited. For instance, memory device 220 may represent a plurality of banks 221 that each may include a plurality of memory arrays 230 (e.g., memory arrays included in a number of banks of DRAM cells, NAND flash cells, etc.) in addition to a plurality subarrays, as described herein. Accordingly, descriptions in the present disclosure may be made with regard to DRAM architectures by way of example and/or clarity. However, unless explicitly stated otherwise, the scope of the present disclosure and claims is not limited to DRAM architectures.

The memory device 220 may include address circuitry 242 to latch address signals provided over a data bus 256 (e.g., an I/O bus from host 211) by I/O circuitry 244 (e.g., provided to external ALU circuitry and to DRAM DQs via local I/O lines and global I/O lines). Status and exception information may be provided from the controller 240 of the memory device 220 to a channel controller 243, for example, through a control bus 254, which in turn may be provided from the channel controller 243 to host 211. Address signals may be received (e.g., from channel controller 243 or another host component) through address circuitry 242 and may be decoded (e.g., via a subarray decoder and/or a row decoder in the address circuitry 242) and/or a column decoder 249 coupled to the read latch circuitry 250 to access the memory array 130. A global row driver 201 configured to activate a complete row (e.g., as shown at 107 in FIG. 1), and all memory cells therein, when the row is addressed may be coupled to the address circuitry 242 and the memory array 230 (e.g., selectably coupled to the rows of memory cells therein via the subrow driver circuitry).

Figure 3:
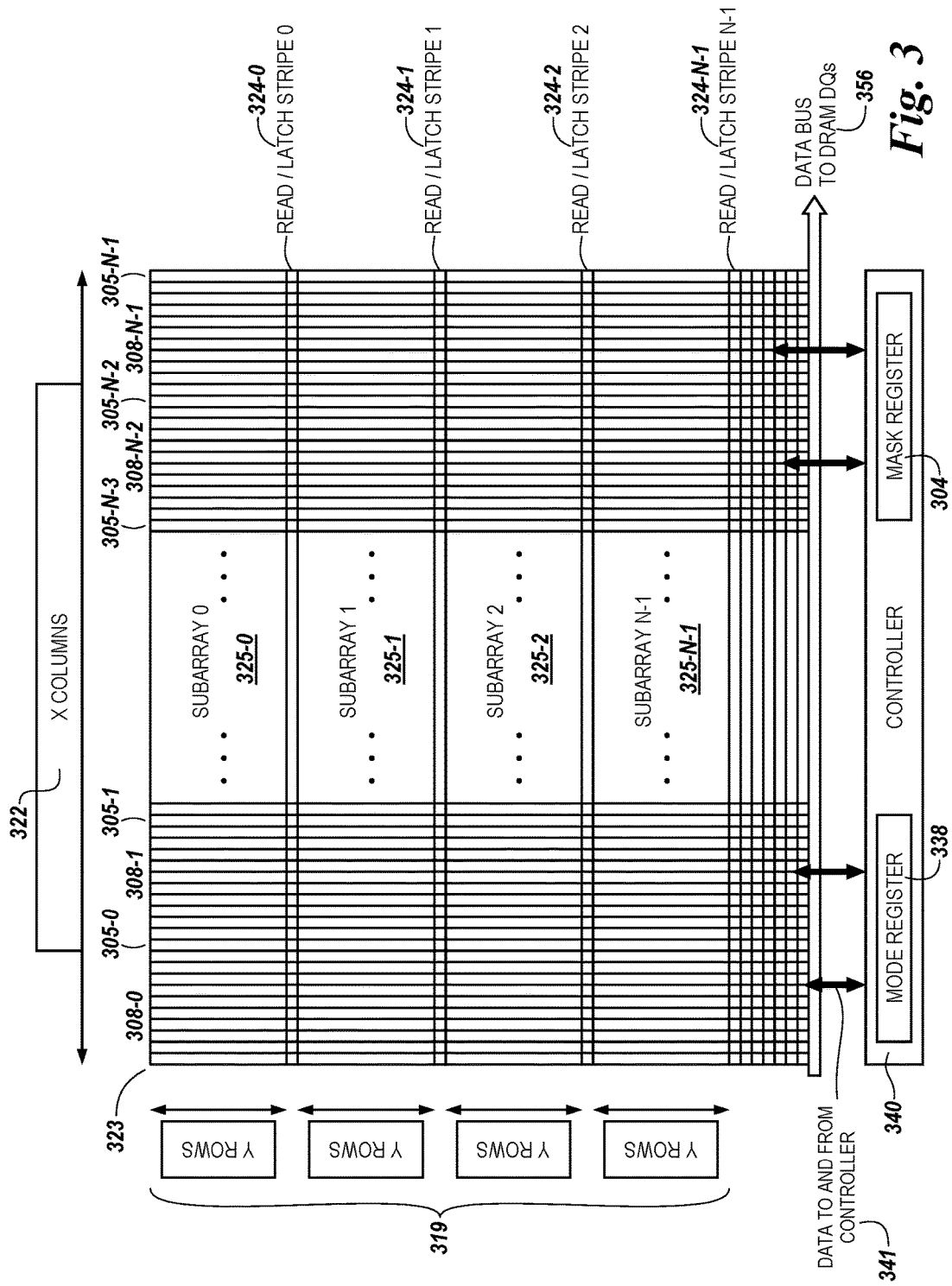
FIG. 3 is a block diagram of a bank section of a portion of a memory device in accordance with a number of embodiments of the present disclosure.

Data may be sensed (read) from memory array 230 by sensing voltage and/or current changes on sense lines (digit lines) using sensing circuitry (e.g., shown as read/latch circuitry 250 in FIG. 2). The read/latch circuitry 250 may include a number of sense amplifiers, as described herein, to read and latch a page (e.g., a row or a subrow, as described herein) of data from the memory array 230. Additional circuitry (e.g., subrow addressing circuitry, as described herein) may be part of, or coupled to, the address circuitry 242, the column decoder 249, the subrow driver circuitry 205 (e.g., subrow drivers and/or subrow decoders), and/or the read/latch circuitry 250. The I/O circuitry 244 may include data I/O pins to be used for bi-directional data communication with host 211 over the data bus 256 (e.g., a 64 bit wide data bus). The data bus 256 may be coupled to DRAM DQs, as shown in FIG. 3. Write circuitry 248 may be used to write data to the memory array 230.

The controller 240 may decode signals (e.g., commands) provided by control bus 254 from host 211. The controller 240 may control operations by issuing signals determined from the decoded commands from host 211. These signals may include chip enable signals, write enable signals, address signals (e.g., subarray address signals, row address signals, and/or subrow address signals), and/or mode signals that may be used to control operations performed on the memory array 230, including data sense, data store, subarray addressing, row addressing, subrow addressing, data move, data write, and data erase operations, among other operations. In various embodiments, the controller 240 may be responsible for executing instructions from host 211 and accessing the memory array 230.

The controller 240 may, in various embodiments, include a mode register 238 configured to enable selection between all of the plurality of memory cells being activated in a row being addressed (e.g., responsive to signals from the global row driver 201) and activation of selected subrows of the plurality of memory cells in the row being addressed (e.g., responsive to latched subrow entries in the mask register 204). In a number of embodiments, all of the memory cells being activated in the row being addressed may be a default mode selection. Selection between the modes in the mode register 238 may be performed responsive to mode signals provided by host 211 though control bus 254.

In the default mode, the controller 240 may direct that signals be sent via the global row driver 201 to all the subrow drivers of the row (e.g., subrow drivers 105-0, 105-2, . . . , 105-N−1) to activate all of the corresponding subrows (e.g., subrows 108-1, 108-2, . . . , 108-N−1 corresponding to row 107 in FIG. 1). Such a default mode may be overcome by selecting the mode for activation of selected subrows in the row consistent with the latched subrow entries in the mask register 204. Responsive to selection of using the latched subrow entries in the mask register 204, the controller 240 may send signals corresponding to the latched subrow entries to inhibit particular subrow drivers of the row from being activated. Inhibiting or preventing a particular subrow driver from being activated may be performed by overriding and/or cancelling a signal from the global row driver 201 and/or by disabling the particular subrow driver from being activated (e.g., by deselecting a gate for activation of the subrow driver, as described further in connection with FIG. 4). Inhibiting activation of particular subrow drivers may prevent corresponding subrows from being activated and data values being accessed therefrom. The data values from the subrows that are activated may thereby include the data values that are selected for processing in the operation to be performed thereon.

In a number of embodiments, a memory device (e.g., as shown at 220 and described in connection with FIG. 2) may include a plurality of subrows within a row of memory cells (e.g., as shown at 108 and 107, respectively, and described in connection with FIG. 1) and a controller (e.g., as shown at 240 and described in connection with FIG. 2) configured to selectably address and manage an activation state of each subrow of the plurality of subrows. The memory device 220 may further include subrow driver circuitry (e.g., as described in connection with subrow drivers 105 in FIG. 1, subrow decoders 427 in FIG. 4, subrow driver circuitry 205 in FIG. 2, and elsewhere herein) coupled to the controller 240. The subrow driver circuitry may be configured to maintain one or more subrows of the plurality (e.g., one or more of subrows 108-0, 108-1, . . . , 108-N−1) in the activation state based at least in part on signaling from the controller 240.

As described herein, the activation state of a subrow may include the subrow being in an active state or in an inactive state. The active state is intended to at least mean the subrow, and the memory cells therein, being accessible by the sensing circuitry (e.g., shown as read/latch circuitry 250 in FIG. 2 and/or the sense amplifiers shown at 506 in FIG. 5). The inactive state is intended to at least mean the subrow, and the memory cells therein, being inaccessible by the sensing circuitry.

For example, in a number of embodiments, the controller 240 may be configured to selectably address and to direct that a subrow at a particular position in the row (e.g., at the position of any one or more of subrows 108-0, 108-1, . . . , 108-N–1 in row 107) remains inactive. To selectably address may, in a number of embodiments, be to use a row address corresponding to a particular row of a plurality of rows and the subrow at the particular position in the row may be directed to remain inactive via an indicator of the subrow (e.g., included in and/or accompanying the row address) including a signal to direct that the subrow remain inactive (e.g., as opposed to another signal to direct that the subrow be activated). The controller may be coupled to the subrow driver circuitry 105, 205 configured to inhibit activation of the subrow at the particular position.

As described herein, a mask register (e.g., as shown at 104 and 204 and described in connection with FIGS. 1 and 2, respectively) may be configured to enable management of the activation state of the plurality of subrows. The controller 240 may be further configured to manage the activation state of the plurality of subrows (e.g., by a number of addresses, indicators, and/or signal sent from the controller 240) based at least in part on enablement by the mask register 204. For example, in a number of embodiments, the mask register 204 may be configured to enable selection from among the plurality of subrows to remain inactive and the controller may be configured to direct that a subrow selected via the mask register remains inactive.

As described herein, a global row driver (e.g., as shown at 101 and 201 and described in connection with FIGS. 1 and 2, respectively) may be configured to maintain, in a first activation state (e.g., active), a first subrow of the plurality via a first subrow driver and maintain, in the first activation state, a second subrow of the plurality via a second subrow driver. For example, the global row driver 201 may be configured to direct activation of the subrow at the particular position via a first subrow driver and activation of the subrow at a different position via a second subrow driver. In a number of embodiments, the global row driver 201 may direct that all of subrows 108-0, 108-1, . . . , 108-N–1 be activated via corresponding and coupled subrow drivers 105-0, 105-1, . . . , 105-N–1 of the subrow driver circuitry.

The mask register 204 may be configured to selectably latch a number of selections (e.g., provided by host 211 and/or a user) from among the plurality of subrows to remain in a second activation state (e.g., inactive). The latched second activation state may inhibit the first activation state via the first and second subrow drivers being deselected (e.g., inactivated) responsive to the latched number of selections.

The subrow driver circuitry 205 may include a subrow driver coupled to the one or more subrows at a particular position. For example, in a number of embodiments, subrow driver 105-1 may only be coupled to subrow 108-1. In a number of other embodiments, subrow driver 105-1 may be coupled both to subrow 108-1 and subrow 108-0 and/or subrow 108-2, among other possible combinations and/or numbers of subrows being coupled to a given subrow driver. Each of the subrow drivers may be configured to control activation of the one or more subrows. The subrow driver circuitry 205 may further include a subrow decoder (e.g., as shown at 427 and described in connection with FIG. 4) coupled to the one or more subrows and/or subrow drivers at the particular position. The subrow decoder may be configured to decode a signal from the controller based at least in part on the activation state of the one or more subrows. For example, the signal from the controller may be decoded to activate a presently inactive subrow driver in order to activate a presently inactive coupled subrow. Alternatively, the subrow decoder may be configured to decode the signal from the controller to determine whether the activation of the subrow is to be inhibited by inactivation of the subrow driver. For example, the signal from the controller may be decoded to inactivate a presently active subrow driver in order to inactivate a presently active coupled subrow.

The subrow driver circuitry 205 may include a first subrow driver (e.g., subrow driver 105-0) coupled to one of the subrows (e.g., 108-0) at a particular position within the row 107 and a second subrow driver (e.g., any of subrow drivers 105-1, 105-2, . . . , 105-N–1) coupled to another one of the corresponding subrows (e.g., any of subrows 108-1, 108-2, . . . , 108-N–1) at a different position within the row 107. The first and second subrow drivers may each be configured to inhibit activation of the corresponding subrow responsive to signaling from the controller 240.

The controller 240 may be configured to selectably address and direct that the subrow at the particular position (e.g., subrow 108-0) remains inactive responsive to signaling that inhibits activation of the first subrow driver (e.g., subrow driver 105-0). In combination, the controller 240 may be configured to selectably address and direct that the subrow at the different position (e.g., any of subrows 108-1, 108-2, . . . , 108-N–1) remains inactive responsive to signaling that inhibits activation of the second subrow driver (e.g., any of subrow drivers 105-1, 105-2, . . . , 105-N–1). Accordingly, the first and second subrow drivers (e.g., all of subrow drivers 105-0, 105-1, . . . , 105-N–1) are each configured to be inactivated responsive to signaling from the controller.

As illustrated in FIG. 1, the subrow driver circuitry 205 may include a plurality of subrow drivers 105-0, 105-1, . . . , 105-N–1, and each subrow driver of the plurality may be coupled to a respective one of the plurality of subrows 108-1, 108-2, . . . , 108-N–1. The plurality of subrow drivers may be positioned between a number of the plurality of subrows. For example, subrow driver 105-0 is positioned between subrows 108-0 and 108-1, subrow driver 105-1 is positioned between subrows 108-1 and 108-2, and subrow driver 105-2 is positioned between subrows 108-2 and 108-N–1. However, when subrow 108-N–1 is the last subrow in row 107, subrow decoder 105-N–1 may be the last subrow decoder and, thus, may not be between two subrows. The plurality of subrows described herein may each include a predetermined number of memory cells, which may be the same in each of the subrows or may vary between different subrows, in a number of embodiments.

FIG. 3 is a block diagram of a bank section 323 of a portion of a memory device 220 in accordance with a number of embodiments of the present disclosure. For example, bank section 323 may represent one of a plurality of bank sections corresponding to a bank 221 of a memory device. A bank architecture may include a plurality of columns (e.g., "X" columns 322 as shown in FIG. 3). Additionally, the bank section 323 may be divided into a plurality of subarrays 325-0 (SUBARRAY 0), 325-1 (SUBARRAY 1), . . . , 325-N–1 (SUBARRAY 325-N–1), which may be separated by respective amplification regions that may include groups (e.g., sets) of sense amplifiers. The groups of sense amplifiers may be referred to as sense amplifier stripes or read/latch stripes. For example, as shown in FIG. 3, each of the subarrays 325-0, 325-1, . . . , 325-N–1 has a read/latch stripe associated therewith (e.g., 324-0, 324-1, . . . , 324-N–1, respectively).

The bank 221 or bank section 323 may include 64 subarrays, 128 subarrays, 256 subarrays, 512 subarrays, among various other possible numbers of subarrays. However, embodiments are not so limited, such that some embodiments of a bank may have a different number of subarrays than just presented. In a number of embodiments, the subarrays may have the same number of rows in each subarray (e.g., 256 rows, 512 rows, 1024 rows, 2048 rows, among various other possible numbers of rows). However, embodiments are not so limited, such that at least some of a plurality of subarrays within the bank or bank section may have different numbers of rows.

Each column 322 is configured to be coupled to read/latch circuitry 250 (e.g., as further described in connection with FIG. 5). As such, each column in a subarray may be coupled individually to a sense amplifier that contributes to a set of sense amplifiers (e.g., a read/latch stripe) for that subarray. For example, as shown in FIG. 3, the bank architecture may include read/latch stripe 0, read/latch stripe 1, . . . , read/latch stripe N–1 (e.g., shown at 124-0, 124-1, . . . , 124-N–1) that each have read/latch circuitry 250 with a set of sense amplifiers that may, in various embodiments, be used as registers, cache, and data buffering. The sense amplifiers (e.g., as shown at 506 and described in connection with FIG. 5) may be coupled to each column 322 in the subarrays 325-0, 325-1, . . . , 325-N–1.

Each of the of the subarrays 325-0, 325-1, . . . , 325-N–1 may include a respective plurality of rows (e.g., a respective group of "Y" rows 319) within a memory array (e.g., as shown at 230 and 530 and described in connection with FIGS. 2 and 5, respectively). As described herein, a plurality of subrows 308-0, 308-1, . . . , 308-N–1 may be formed within each of the plurality of rows 319. In some embodiments, each subrow of the plurality or rows may include a same quantity of memory cells. A plurality of subrow drivers 305-0, 305-1, . . . , 305-N–1 may correspond to respective ones of the plurality of subrows. For example, subrow driver 305-0 may be coupled to subrow 308-0 in one row of rows 319 and subrow driver 305-1 may be coupled to subrow 308-1 in the same row of rows 319, etc. However, in a number of embodiments, subrow driver 305-0 may be coupled to subrow 308-0 in more than one row of rows 319 (e.g., in all rows of subarray 325-0 or in all rows of subarrays 325-0, 325-1, . . . , 325-N–1). Similarly, subrow drivers 305-1, 305-2, . . . , 305-N–1 may be coupled to corresponding subrows 308-1, 308-2, . . . , 308-N–1 in more than one row of rows 319.

A number of the plurality of subrow drivers 305 may be positioned between subrows 308 of each of a plurality of rows 319. Each subrow driver 305 may be coupled to one subrow 308 of the plurality of subrows in each of the plurality of rows 319. A predetermined number of memory cells (e.g., 128, 256, 512, 1024, or 2048 memory cells) may separate the number of the subrow drivers for each of the plurality of subrows.

Controller 340 shown in FIG. 3 may represent and/or include at least the functionality of the controller shown at 240 and described in connection with FIG. 2. For example, in a number of embodiments, the controller 340 may be coupled to a mask register 304 and/or a mode register 340 that may each be configured to function consistent with the corresponding mask register 204 and/or a mode register 240 described in connection with FIG. 2. In addition, the mask register 304 and/or mode register 340 may each be configured to interact with (e.g., control) subrow drivers (e.g., 305-0, 305-1, . . . , 305-N–1) and/or the subrow decoders (e.g., as shown at 427 and described in connection with FIG. 4) for subrows (e.g., 308-0, 308-1, . . . , 308-N–1) in each of a plurality of row 319 in a plurality of subarrays (e.g., 325-0, 325-1, . . . , 325-N–1).

The controller 340 may be configured to provide a row activation signal to the row (e.g., via global row driver 201) and inhibit activation of a selected one of the plurality subrows 308 responsive to the row activation signal via a signal received by a subrow driver 305 corresponding to the selected one of the plurality of subrows. The controller may address a subrow driver coupled to a subrow at a particular position using a signal for selective activation (e.g., activation or inactivation) of the subrow driver. A subrow decoder (e.g., coupled to the addressed subrow driver as part of the subrow driver circuitry 205) may be configured to decode the signal to select or deselect a gate for activation of the subrow driver. For example, decoding the signal and selecting the gate may result in activation of the coupled subrow driver, whereas decoding the signal and deselecting the gate may result in inactivation of the coupled subrow driver (e.g., as described further in connection with FIG. 4). Accordingly, the controller 340 may be configured to selectably address a particular row and direct that a subrow at a particular position in the row remains inactive.

A mask register (e.g., as shown at 104, 204, and 304 and described in connection with FIGS. 1, 2 and 3, respectively) may be configured to enable selection of one subrow and/or a plurality of the subrows (e.g., depending on which row is being addressed) to remain inactive. The mask register may be configured to enable inhibition of activation of selected subrows of memory cells in a row being addressed and provide a row address that includes an indication of which subrow driver for a particular subrow in the particular row is deselected for activation. The mask register may be configured to enable inhibition of activation of a plurality of subrows in a particular row. For example, the mask register may be configured to enable inhibition of activation of the plurality of subrows while at least one subrow in the particular row is activated. The mask register may be configured to enable inhibition of activation of different subrows in each of the plurality of rows. The controller 340 may be configured to direct (e.g., via a signal) that one or more subrows selected via the mask register remain inactive. In a number of embodiments, the mask register may be configured to inhibit performance of a refresh operation (e.g., in a DRAM configuration) on the subrow at the particular position responsive to the subrow remaining inactive and promote performance of a refresh operation on a subrow at a different position responsive to the subrow being activated.

As described herein, a memory device (e.g., as shown at 220 and described in connection with FIG. 2) may be operated by receiving a first signal (e.g., from controller 340 as enabled by mask register 304 and/or mode register 338) by a first subrow driver (e.g., 305-0) coupled to a first subrow (e.g., 308-0) of a plurality of subrows within a row (e.g., one row selected from rows 319). Activation of the first subrow driver 305-0 may thus be deselected to inhibit activation of the first subrow 308-0 in response to receiving the first signal (e.g., as described further in connection with FIG. 4). A second signal may be received (e.g., from controller 340 via global row driver 201) by a second subrow driver (e.g., one or more of 305-1, 306-2, . . . , 305-N-1) coupled to a second subrow (e.g., one or more of 308-1, 308-2, . . . , 308-N-1) of the plurality of subrows. Activation of the second subrow driver may thus be selected to activate the second subrow in response to receiving the second signal.

Access to a plurality of memory cells of the first subrow by sense amplifiers coupled to the plurality of memory cells (e.g., as described in connection with FIG. 5) may be prevented responsive to inhibiting activation of the first subrow. Storage, by the sense amplifiers, of data values corresponding to the plurality of memory cells may be prevented by preventing access to the memory cells.

Accordingly, responsive to inhibiting activation of a number of subrows, access to the number of subrows, and the plurality of memory cells therein, may be prevented and storage of a number of data values corresponding to the number of subrows, and the plurality of memory cells therein, also may be prevented. By inhibiting the activation of the subrows, and consequently preventing access to the subrows and storage of the data values, an amount of energy used by (e.g., electrical power to enable operation of) the memory device may be reduced. The reduced amount of energy that is used may correspond to the number of subrows being inhibited from activation relative to energy used for activation of all of the plurality of subrows within the row in a different operating mode of the memory device (e.g., the default mode, as described herein).

All of the subrows being activated within a row that is addressed is consistent with implementations conforming to standards and protocols (e.g., JEDEC, DDR3, DDR4, etc.) that activate a complete row of memory cells at a time. However, activating all of the subrows, accessing all of the subrows, and storing all of the data values accessed therefrom may use an amount of energy that may be reduced (e.g., is unnecessary) for access to, and performance of operations on, data values stored only in a subset of the subrows in the row. Hence, the independent subrow addressing described herein (e.g., utilizing the mask register, mode register, subrow addressing circuitry, and signaling pathways, etc.) may provide a technical advantage by enabling energy consumed by performance of an operation on a particular subset of data values stored by a number of subrows of a row to more closely correspond to the size of the particular subset of data values.

Whereas each subrow driver 105-0, 105-1, . . . , 105-N-1 shown in FIG. 1 may have a single connection (e.g., be individually coupled to) a corresponding subrow 108-0, 108-1, . . . , 108-N-1, embodiments of such coupling are not so limited. For example, the subrow driver circuitry 305-0, 305-1, . . . , 305-N-1 shown in FIG. 3 may correspond to the subrow driver circuitry 105-0, 105-1, . . . , 105-N-1 shown in FIG. 1 in that there may be a different subrow driver and/or a different subrow decoder coupled to each of the subrows 308-0, 308-1, . . . , 308-N-1 in each of the rows 319 of each of the subarrays 325-0, 325-1, . . . , 325-N-1. Alternatively, the subrow driver circuitry 305-0, 305-1, . . . , 305-N-1 may be circuitry that extends across a subarray (e.g., in subarray 325-0, in the direction of the columns 322 perpendicular to each of the rows 319 therein) such that each subrow driver (e.g., 305-0) may have a plurality of connections so as to be individually coupled to the subrows (e.g., 308-0) in each of the rows 319.

FIG. 3 shows a number of columns 322 that include a corresponding number of memory cells (e.g., the memory cells of memory array 530 illustrated in FIG. 5) for each subrow 308-0, 308-1, . . . , 308-N-1 of each row 319. There may be a plurality of rows in each subarray, where each row may include a plurality of memory cells corresponding to respective columns. The number of columns and/or memory cells in each subrow 308 separated by and coupled to corresponding subrow driver circuitry (e.g., subrow drivers and/or subrow decoders 305-0, 305-1, . . . , 305-N-1) is shown in FIG. 3 to be ten (10) by way of example and not limitation. For example, there may be 128, 256, 512, 1024, or 2048 columns and/or memory cells, among other possibilities, in each subrow 308 separated by and coupled to corresponding subrow driver circuitry 305. In a number of embodiments, some of the subrows may include a different number of columns and/or memory cells than other subrows. For example, the subrows of subarray 325-0 may be configured to include a different number of columns and/or memory cells than the subrows of one or more of subarrays 325-1, 325-2, . . . , 325-N-1, which also may differ from each other. Accordingly, in a number of embodiments, there may be a different number of subrows in different rows when each row has the same number of columns and/or memory cells. The spacing and/or coupling of the sensing circuitry (e.g., sense amplifiers as shown at 506 in FIG. 5) in the read/latch stripes 324-0, 324-0, . . . , 324-N-1 may be adjusted for each corresponding subarray 325-0, 325-1, . . . , 325-N-1 as suitable for the number of columns and/or memory cells in each subrow being separated and/or coupled to the corresponding subrow driver circuitry 305.

The controller 340 may be configured, as shown at 341, to provide data to (e.g., as received from host 211) the bank 221, section of the bank 323, rows 319, and/or subrows 308 and/or to retrieve and/or access data therefrom. The section of the bank 323 illustrated in FIG. 3 shows data bus 356 to DRAM DQs of host 211 coupled to the controller 340 and/or the I/O circuitry 244 of the memory device 220.

FIG. 4 is a schematic diagram illustrating circuitry for subrow addressing in accordance with a number of embodiments of the present disclosure. As shown in FIG. 4, the circuitry for subrow addressing may, in a number of embodiments, include a global row driver 401 (e.g., as shown at 101 and 201 and described in connection with FIGS. 1 and 2, respectively). The global row driver 401 may selectably send an activation signal via a global row line 426 connected to (e.g., coupled to) a row and to each of the subrows in the row, the activation signal to each of the subrows capable of being inhibited (e.g., overridden, canceled), as described herein. For example, each global row line 426 may be potentially coupled to each of the subrows (e.g., subrows 408-0, 408-1, etc.) that contribute to formation of a row. In various embodiments, there may, for example, be 64, 128, 256, 512, or 1024 subrows vertically positioned (one above and/or below the other) in each of a number of mats (e.g., of a subarray having 16 mats).

The global row driver 401 may, in some embodiments, be coupled to a number of global row lines 426 that are individually coupled to every row/subrow to activate one row/subrow at a time. Each global row line 426 may be configured to carry an activation signal (e.g., having a value of 1 in binary) sent from the global row driver 401 to a selected row and the subrow driver (e.g., as shown at 405-0, 405-1, etc.) of the selected subrow. The activation signal may be sent, for example, to a number of gates 428 (e.g., logic gates configured to perform a Boolean AND function based upon input of two binary values) in the subrow drivers 405-0, 405-1 corresponding (e.g., coupled) to each of the respective subrows 408-0, 408-1.

In a number of embodiments, as shown in FIG. 4, there may be a subrow decoder 427 coupled to each subrow driver 405. The coupled subrow decoder 427 and subrow driver 405 contribute to, or may be, the subrow driver circuitry shown at 205 and described in connection with FIG. 2. For example, subrow decoder 427-0 may be coupled to subrow driver 405-0 and subrow decoder 427-1 may be coupled to subrow driver 405-1, etc. Each subrow decoder 427 may be coupled to the corresponding subrow driver 405 to provide a signal to the gate 428 (e.g., the logic gate) to selectably disable, consistent with the entries corresponding to particular subrow addresses that are stored in the mask register (e.g., as shown at 304 and described in connection with FIG. 3 and elsewhere herein), activation of the one or more subrows 408 of the row potentially activated via the activation signal from the global row driver 401.

For example, each subrow decoder 427 for each subrow driver 405 may be configured to allow selection of any of the subrows that would be potentially activated via the signal from the global row driver 401. The selection may be made consistent with the entries stored in the mask register 304. Using appropriately configured circuitry coupled to, for example, the gate 428 (e.g., the AND logic gate), a signal may be sent to the subrow driver 405 to selectably disable activation of (e.g., deselect) a particular subrow that would be activated via the activation signal from the global row driver 401. For example, an activation signal with a binary value of 1 may be sent from the global row driver 401 to the AND logic gate and a signal (e.g., a first signal with a binary value of 1) may be sent from the subrow decoder 427 as a second input to the AND logic gate to deselect activation of a particular subrow 408 of the row potentially activated via the activation signal from the global row driver 401.

In a number of embodiments, when there is no entry stored in the mask register 304 for the particular subrow, a signal (e.g., a second signal with a binary value of 0) may be sent from the subrow decoder 427 as a second input to the AND logic gate in order to select activation of the particular subrow 408 of the row in combination with the activation signal from the global row driver 401. In some embodiments, when there is no entry stored in the mask register 304 for the particular subrow, a signal may not be sent from the subrow decoder 427 as a second input to the AND logic gate. In such an instance, a default signal with a binary value of 0 may be input to the AND logic gate to select for activation of the particular subrow 408 of the row in combination with the activation signal from the global row driver 401.

In some embodiments, each global row line 426 from the global row driver 401 may be coupled to a plurality (e.g., 2, 4, 6, 16, etc.) of rows, along with the corresponding subrows (e.g., to overcome potential crowding of and/or limited area for the global row lines 426). For example, each global row line 426 may be coupled to a sequence of four subrows among a plurality of subrows (e.g., 512 subrows above and/or below the other) in each of 16 mats. An activation signal from the global row driver 401 may then potentially activate all four subrows coupled to a particular global row line 426, via the appropriate subrow driver 405, in each of the 16 mats. In such an embodiment, circuitry of the subrow decoder 427 may be configured to determine and direct the appropriately disabled activation, via the subrow driver 405, of one or more of the potentially activated subrows (e.g., based on the entries stored in the mask register 304).

Figure 5:
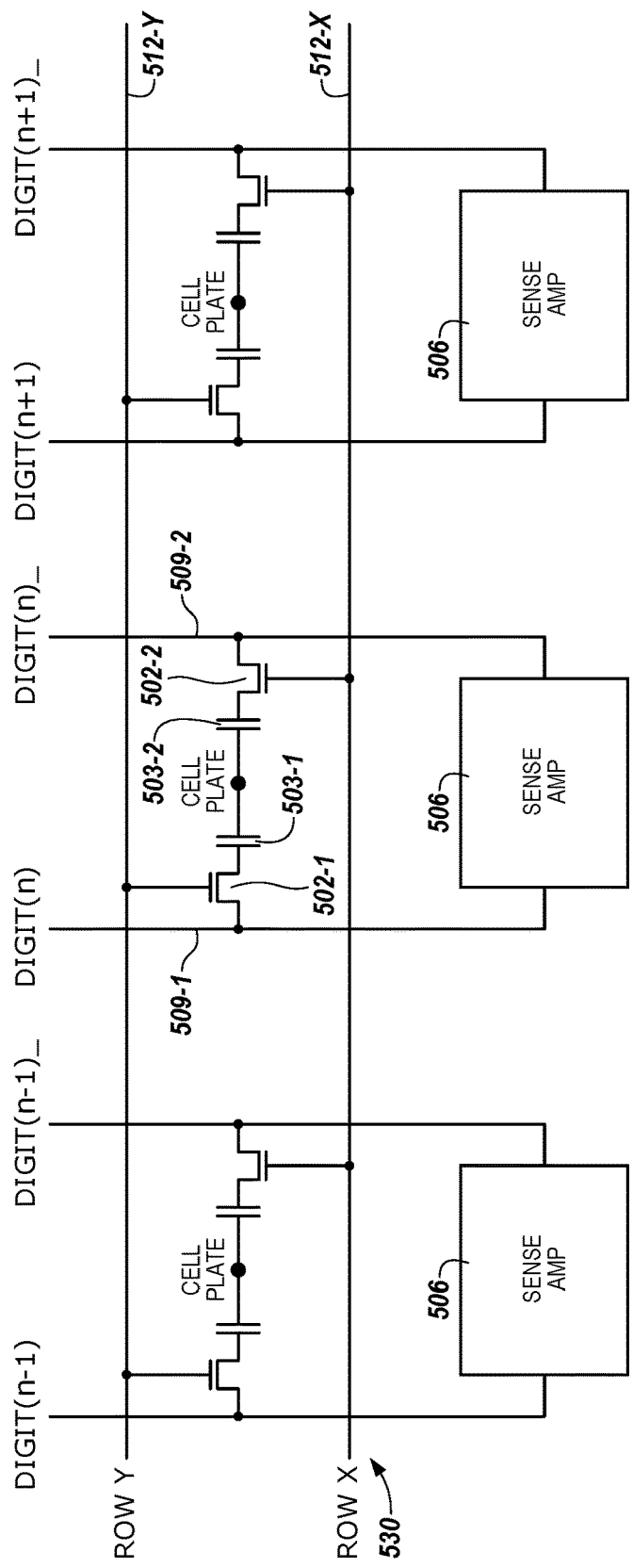
FIG. 5 is a schematic diagram of a portion of a memory device in accordance with a number of embodiments of the present disclosure.

FIG. 5 is a schematic diagram of a portion of a memory device in accordance with a number of embodiments of the present disclosure. FIG. 5 illustrates an example that includes 1T1C memory cells, in a folded DRAM configuration, that are each coupled to a sense amplifier 506. However, embodiments are not so limited, such that some embodiments may have memory cells in a 2T2C configuration or a 3T configuration.

In the embodiment illustrated in FIG. 5, the memory array 530 is an array (e.g., a DRAM array) of memory cells that may each include an access device 502 (e.g., a transistor) and a storage element 503 (e.g., a capacitor, a ferroelectric capacitor, etc.). The memory cells of the memory array 530 may be arranged in rows (as shown at 107 in FIG. 1 and at 319 in FIG. 3) coupled by access lines 512-X (Row X), 512-Y (Row Y), etc., and columns coupled by pairs of complementary sense lines DIGIT(n−1)/DIGIT(n−1)_, DIGIT(n)/DIGIT(n)_, and DIGIT(n+1)/DIGIT(n+1)_, etc. The individual sense lines corresponding to each pair of complementary data lines may be referred to as sense lines 509-1 (DIGIT(n)) and 509-2 (DIGIT(n)_) respectively. Although only three pairs of complementary sense lines are shown in FIG. 5, embodiments of the present disclosure are not so limited, and an array of memory cells may include additional columns of memory cells and/or sense lines (e.g., 4,096, 8,192, 16,384, etc.). As shown in FIG. 5, a gate of a particular memory cell transistor 502 may be coupled to its corresponding access line 512-X, 512-Y, etc., a first source/drain region may be coupled to its corresponding sense line (e.g., 509-1 (DIGIT(n), 509-2 (DIGIT(n)_), and a second source/drain region of a particular memory cell transistor may be coupled to its corresponding capacitor 503.

Memory cells may be coupled to different sense lines and/or access lines. For example, a first source/drain region of a transistor 502-1 may be coupled to sense line 509-1, a second source/drain region of transistor 502-1 may be coupled to capacitor 503-1, and a gate of a transistor 502-1 may be coupled to access line 512-Y. A first source/drain region of transistor 502-2 may be coupled to sense line 509-2, a second source/drain region of transistor 502-2 may be coupled to capacitor 503-2, and a gate of a transistor 502-2 may be coupled to access line 512-X. The cell plate, as shown in FIG. 2, may be coupled to each of capacitors 503-1 and 503-2. The cell plate may be a common node to which a reference voltage (e.g., ground) may be applied in various memory array configurations. In some examples, such as those that utilize ferroelectric capacitors, the cell plate may be coupled to a voltage source and may be energized during access operations to the memory cell.

As described herein, the transistors 502 and capacitors 503 may contribute to formation of the pairs of complementary memory cells in a single row of the memory array 530 that are coupled to the complementary sense lines (e.g., sense lines 509-1 and 509-2). The number of data values (e.g., voltages) sensed from the memory cells (e.g., in read operations) may correspond to the number of columns of memory cells and/or pairs of sense lines (e.g., 4,096, 8,192, 16,384, etc.) that intersect a row, for example, of a subarray 325 shown in and described in connection with FIG. 3.

The memory array 530 illustrated in FIG. 5 is coupled to sensing circuitry (e.g., shown as read/latch circuitry 250 in FIG. 2 and described in connection with read/latch stripe 124 in FIG. 1 and read/latch stripes 324 in FIG. 3). In a number of embodiments, the read/latch circuitry may include the sense amplifier 506 corresponding to respective columns of memory cells (e.g., coupled to respective pairs of complementary sense lines 509-1, 509-2). The sense amplifier 506 may be operated to determine a data value (e.g., logic state) stored in a selected memory cell. The sense amplifier 506 may include a cross coupled latch (not shown). The sense amplifier 506 may be coupled to equilibration circuitry (not shown), which may be configured to equilibrate the sense lines 509-1, 509-2.

A plurality of sense amplifiers (e.g., as shown at 506) may be coupled to the respective plurality of columns (e.g., as shown at 322 and described in connection with FIG. 3) of a memory array 530 (e.g., via sense lines 509-1, 509-2). A subrow at a particular position (e.g., subrow 308-0 in one of rows 319) remaining inactive may prevent access to a plurality of memory cells of the subrow by sense amplifiers corresponding to the plurality of memory cells. To prevent access to the memory cells of the subrow may prevent storage of a number of data values by a plurality of sense amplifiers corresponding to the plurality of memory cells.

Figure 6:
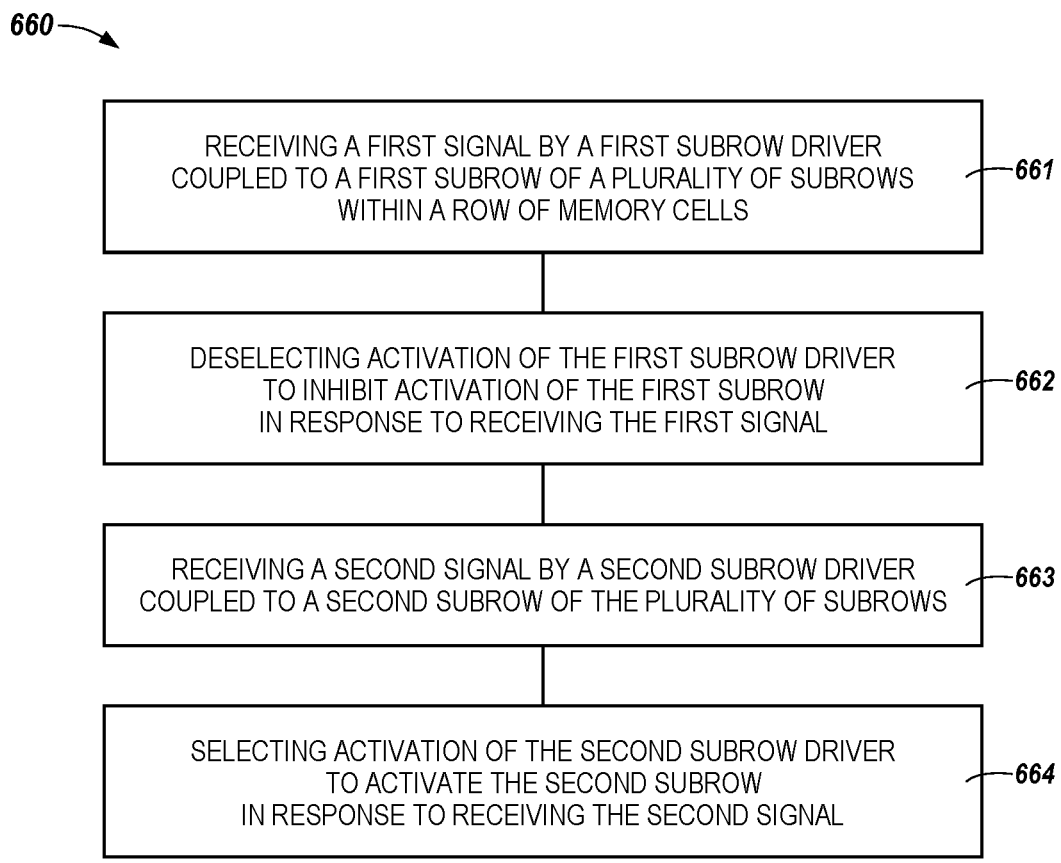
FIG. 6 is a flow chart for subrow addressing in accordance with a number of embodiments of the present disclosure.

FIG. 6 is a flow chart of an embodiment of a method 660 for subrow addressing in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 661, the method 660 may include receiving a first signal by a first subrow driver coupled to a first subrow of a plurality of subrows within a row of memory cells. The operations of block 661 may, in a number of embodiments, be performed by a subrow driver 105, 305, or 405 (e.g., as described in connection with FIGS. 1, 3, and 4). Each subrow driver may be individually coupled to a respective subrow 108, 308, or 408 (e.g., as described in connection with FIGS. 1, 3, and 4) in a row 107 or 319 of memory cells (e.g., as described in connection with FIGS. 1 and 3).

At block 662, the method 660 may include deselecting activation of the first subrow driver to inhibit activation of the first subrow in response to receiving the first signal. The operations of block 662 may, in a number of embodiments, be performed (e.g., as described in connection with FIG. 4) by a subrow decoder (e.g., subrow decoder 427-0) configured to decode a signal to determine whether activation of a subrow (e.g., subrow 428-0) is to be inhibited by inactivation of the coupled subrow driver (e.g., subrow driver 405-0). In a number of embodiments, the first signal may be decoded to inhibit (e.g., prevent) activation of a presently inactive subrow driver in order to inhibit activation of a presently inactive coupled subrow or to inactivate a presently active subrow driver in order to inactivate a presently active coupled subrow. Each subrow decoder 427 may be coupled to a corresponding subrow driver 405 to provide a signal to a gate 428 (e.g., deselect) to inhibit activation of a subrow 408 potentially activated via an activation signal from a global row driver 101, 201, or 401 (e.g., as described in connection with FIGS. 1, 2, and 4).

At block 663, the method 660 may include receiving a second signal by a second subrow driver (e.g., subrow driver 405-1) coupled to a second subrow (e.g., subrow 408-1) of the plurality of subrows. The second signal may be sent by the global row driver 401 to the second subrow driver.

At block 664, the method 660 may include selecting activation of the second subrow driver 405-1 to activate the second subrow 408-1 in response to receiving the second signal. In a number of embodiments, (e.g., in the absence of the first signal to inhibit activation of the second subrow 408-1), the second signal to a gate 428 of the second subrow driver 405-1 may select activation of the second subrow 408-1. Activation of the second subrow driver 405-1 may thus be selected to activate the second subrow 408-1 in response to receiving the second signal.

Ordinal positioning, as used herein, is used to distinguish between relative positions of elements within respective groups of elements. For example, rows of memory cells may each include a sequence of 16 subrows (e.g., subrow 0 through subrow 1). In this example, subrow 0 from a particular row (e.g., a first subrow of the particular row) has a different ordinal position than any of subrows 1 through 15 (e.g., a last subrow) of the row. However, use herein of ordinal numbers such as "first" and "second" is not intended to indicate a particular ordinal position of an element, unless the context clearly dictates otherwise. For example, consider a subrow having an ordinal position of subrow 0 within a particular row and a different subrow having an ordinal position of subrow 4. In this example, subrow 0 might be referred to as a "first" subrow and subrow 4 might be referred to as a "second" subrow, despite not having an ordinal position of subrow 2. Alternatively, subrow 4 might be referred to as a "first" subrow and subrow 0 might be referred to as a "second" subrow.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated may be included. It is also to be understood that the terminology used herein is for the purpose of describing particular embodiments only, and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context. The terms "data" and "data values" are used interchangeably herein and may have the same meaning, as appropriate to the context (e.g., one or more data units or "bits").

While example embodiments including various combinations and configurations of read/latch circuitry, sense amplifiers, read/latch stripes, subrow driver circuitry, subrow drivers, subrow decoders, mask registers, mode registers, and/or multiplexers, among other circuitry for subrow addressing shown and described herein, have been illustrated and described herein, embodiments of the present disclosure are not limited to those combinations explicitly recited herein. Other combinations and configurations of the read/latch circuitry, sense amplifiers, read/latch stripes, subrow driver circuitry, subrow drivers, subrow decoders, mask registers, mode registers, and/or multiplexers, among other circuitry for subrow addressing, disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a plurality of subrows within a row of memory cells;
a mask register configured to enable management of an activation state of each of the plurality of subrows based, at least in part, on subrow selections latched by the mask register; and
a controller configured to selectably address and manage the activation state of each subrow of the plurality responsive, at least in part, to the subrow selections latched by the mask register.

2. The apparatus of claim 1, wherein the activation state of a subrow comprises an active state or an inactive state.

3. The apparatus of claim 1, wherein the controller is further configured to manage the activation state of the plurality of subrows based at least in part on enablement by the mask register.

4. The apparatus of claim 1, further comprising:
a global row driver configured to maintain, in a first activation state, a first subrow of the plurality via a first subrow driver and maintain, in the first activation state, a second subrow of the plurality via a second subrow driver; and
the mask register further configured to:
selectably latch a number of selections from among the plurality of subrows to remain in a second activation state; and
inhibit the first activation state via the first and second subrow drivers responsive to the latched number of selections.

5. The apparatus of claim 1, further comprising:
a subrow driver coupled to one or more subrows at a particular position, the subrow driver configured to control activation of the one or more subrows; and
a subrow decoder coupled to the one or more subrows at the particular position, the subrow decoder configured to decode a signal from the controller based at least in part on the activation state of the one or more subrows determined from the subrow selections latched by the mask register.

6. The apparatus of claim 1, further comprising:
a first subrow driver coupled to one of the subrows at a particular position within the row; and
a second subrow driver coupled to another one of the subrows at a different position within the row;
wherein the first and second subrow drivers are each configured to inhibit activation of the corresponding subrow responsive to signaling based at least in part on the subrow selections latched by the mask register.

7. The apparatus of claim 1, wherein:
the controller is further configured, based at least in part on the subrow selections latched by the mask register, to selectably address and direct that:
a subrow at a particular position remains inactive responsive to signaling that inhibits activation of a first subrow driver; and
a subrow at a different position remains inactive responsive to signaling that inhibits activation of a second subrow driver.

8. The apparatus of claim 1, wherein:
the mask register is further configured to enable selection of a plurality of the subrows to remain inactive; and
the controller is further configured to direct that a subrow selected via the mask register remains inactive.

9. A system, comprising:
a plurality of rows in a memory array, wherein each row comprises a plurality of memory cells;
a mask register configured to enable inhibition of activation of selected subrows within a particular row being addressed; and
a controller configured to selectably enable inhibition of activation of a subrow at a particular position in the row based, at least in part, on the mask register.

10. The system of claim 9, further comprising a host selectably coupled via a control bus to the mask register and configured to provide signals corresponding to addresses of selected subrows to be latched by the mask register.

11. The system of claim 9, further comprising:
a mode register configured to enable selection between:
all of the plurality of memory cells being activated in a row being addressed; and
activation of selected subrows in the row being addressed based at least in part on the particular position of the selected subrow latched by the mask register.

12. The system of claim 9, wherein the mask register is further configured to provide an address that comprises an indication of which subrow driver for a particular subrow in the particular row is deselected for activation.

13. The system of claim 9, wherein the mask register is further configured to:
enable inhibition of activation of a plurality of subrows in the particular row while at least one subrow in the particular row is activated; and
enable inhibition of activation of different subrows in each of the plurality of rows.

14. The system of claim 9, wherein the mask register is further configured to:
inhibit performance of a refresh operation on the subrow at the particular position responsive to the subrow remaining inactive; and
promote performance of a refresh operation on a subrow at a different position responsive to the subrow being activated.

15. The system of claim 9, wherein:

the mask register is coupled to a global row driver and is further configured to detect that the global row driver has selected a particular row for activation;

responsive to detection by the mask register that the particular row is selected, the mask register is further configured to determine subrow addresses latched by the mask register that correspond to the particular row selected; and responsive to determination of the subrow addresses latched by the mask register, the controller is further configured to inhibit activation of a number of subrow drivers for subrows corresponding to the latched subrow addresses.

16. The system of claim 9, wherein the controller is further configured to inhibit activation of a particular subrow, consistent with the particular position in the row latched by the mask register, via a deselect signal sent by the controller to a subrow driver coupled to the particular subrow.

17. A method for operating a memory device, comprising:

receiving a first signal by a first subrow driver coupled to a first subrow responsive to a latched entry in a mask register, the latched entry indicating a position of the first subrow among a plurality of subrows within a row of memory cells; and in response to receiving the first signal, deselecting activation of the first subrow driver to inhibit activation of the first subrow.

18. The method of claim 17, further comprising:

receiving a second signal, from a global row driver, by a second subrow driver coupled to a second subrow of the plurality of subrows; and selecting activation of the second subrow driver to activate the second subrow in response to receipt of the second signal.

19. The method of claim 17, further comprising:

responsive to inhibiting activation of the first subrow based on the position of the first subrow latched by the mask register:

preventing access to a plurality of memory cells of the first subrow by sense amplifiers coupled to a plurality of columns corresponding to the plurality of memory cells; and preventing storage, by the sense amplifiers, of data values corresponding to the plurality of memory cells.

20. The method of claim 17, further comprising:

responsive to inhibiting activation of a number of subrows based on positions of the number of subrows latched by the mask register:

preventing access to the number of subrows;

preventing storage of a number of data values corresponding to the number of subrows; and reducing an amount of energy used by the memory device, wherein the reduced amount of energy used corresponds to the number of subrows being inhibited from activation relative to energy used for activation of all of the plurality of subrows within the row in a different operating mode of the memory device.

* * * * *